(12) United States Patent
Han et al.

(10) Patent No.: US 7,732,907 B2
(45) Date of Patent: Jun. 8, 2010

(54) INTEGRATED CIRCUIT PACKAGE SYSTEM WITH EDGE CONNECTION SYSTEM

(75) Inventors: Byung Joon Han, Singapore (SG); Il Kwon Shim, Singapore (SG); Seng Guan Chow, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 387 days.

(21) Appl. No.: 11/421,051

(22) Filed: May 30, 2006

(65) Prior Publication Data
US 2007/0278660 A1    Dec. 6, 2007

(51) Int. Cl.
H01L 23/02    (2006.01)

(52) U.S. Cl. ............... 257/686; 257/E23.172; 257/685; 257/698; 438/106; 438/109; 361/752

(58) Field of Classification Search ......... 257/698, 257/777, 778, 686, E23.172, E23.101, E23.177, 257/783, 685; 361/752, 760, 720, 748, 775; 439/361, 716, 631; 174/72 B, 99 B, 70 B, 174/88 B; 438/15, 106, 107, 109, 117, FOR. 336–FOR. 368
See application file for complete search history.

(56) References Cited

U.S. PATENT DOCUMENTS

| | | | | |
|---|---|---|---|---|
| 5,016,138 | A | * | 5/1991 | Woodman ............... 361/688 |
| 5,111,278 | A | | 5/1992 | Eichelberger |
| 5,247,423 | A | * | 9/1993 | Lin et al. ............... 361/719 |
| 5,604,377 | A | | 2/1997 | Palagonia |
| 5,857,858 | A | | 1/1999 | Gorowitz et al. |
| 6,024,581 | A | | 2/2000 | Barnett et al. |
| 6,225,688 | B1 | * | 5/2001 | Kim et al. ............... 257/686 |
| 6,537,852 | B2 | | 3/2003 | Cohn et al. |
| 6,667,555 | B2 | | 12/2003 | Cohn et al. |
| 6,898,085 | B2 | * | 5/2005 | Haba et al. ............. 361/760 |
| 2006/0097402 | A1 | * | 5/2006 | Pu et al. ................ 257/777 |
| 2006/0170090 | A1 | * | 8/2006 | Shinma et al. .......... 257/686 |

* cited by examiner

*Primary Examiner*—Chris C Chu
(74) *Attorney, Agent, or Firm*—Mikio Ishimaru

(57) ABSTRACT

An integrated circuit package system including a plurality of substrates and a plurality of semiconductor devices formed on each of the substrates. An edge connection system is provided and an electrical edge connector on each of the substrates is for attachment to the edge connection system. A vertically stacked configuration of the substrates is formed by attaching the substrates to the edge connection system.

20 Claims, 2 Drawing Sheets

INTEGRATED CIRCUIT PACKAGE SYSTEM WITH EDGE CONNECTION SYSTEM

TECHNICAL FIELD

The present invention relates generally to integrated circuits, and more particularly to integrated circuit package systems.

BACKGROUND ART

Integrated circuits are what power many of today's consumer electronics, for instance, cellphones, video cameras, portable music players, computers, etc. As customer demand improves integrated circuit performance, faster, more reliable, and higher-density circuits, need to be produced at a lower cost. Packaging goals of the future for these integrated circuits will be met by increasing the density of chips while reducing the number of internal electrical interconnections. Packaging with fewer interconnects can potentially shorten the circuit length, decreases potential failure points, reduces circuit resistance, and reduce inter-line capacitance or crosstalk. Various techniques, such as, flip chip, ball grid array (BGA), chip on board (COB), and multi-chip modules (MCM), have been developed to meet the continued demands for improving integrated circuit system performance.

MCM packaging is a design that enhances electrical performance by reducing circuit resistance and parasitic capacitance while reducing the size and weight of the total package. MCM package configurations mount several die onto a substrate, which permits a higher density per unit area than direct attachment of each individual die to a printed circuit board. Ultimately, as the demand for higher-density circuits continued, MCM package configurations needed to evolve to the next generational level.

For even higher density applications, MCM substrates have been stacked to provide a three-dimensional structure. Unfortunately, stacked MCM substrates are prone to expensive and complex layer formation, warpage and co-planarity issues, interconnection difficulties, heat dissipation problems and electromagnetic interference dilemmas. For example, impedance mismatches and capacitive interferences within interconnects between modules, may cause discontinuities in signal transmissions that can result in erroneous data transmissions. Additionally, heat dissipation problems are confounded by the use of heat sinks, which disrupt interconnect patterns between adjacent MCM substrates. Furthermore, high frequency applications on one MCM substrate can disrupt integrated circuit systems sensitive to such energy on adjacent MCM substrates.

Thus, a need still remains for an integrated circuit package system employing multiple substrates, each with one or more semiconductor chips, which reduces fabrication complexities and answers operational difficulties. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including a plurality of substrates and a plurality of semiconductor devices formed on each of the substrates. An edge connection system is provided and an electrical edge connector on each of the substrates is for attachment to the edge connection system. A vertically stacked configuration of the substrates is formed by attaching the substrates to the edge connection system.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
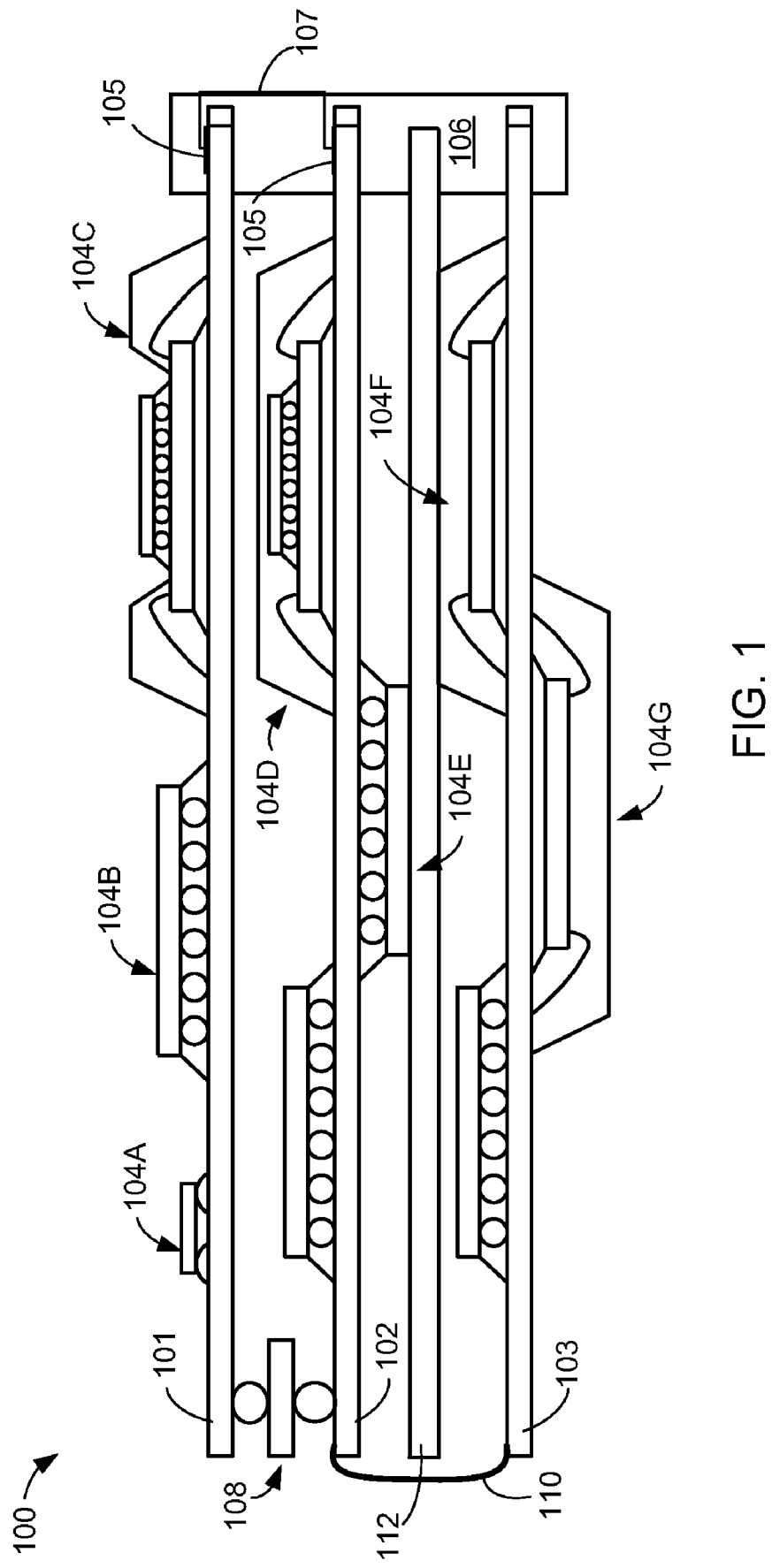
FIG. 1 is a cross-sectional view of an integrated circuit package system in accordance with an embodiment of the present invention.

The following embodiments are described in sufficient detail to enable those skilled in the art to make and use the invention, and it is to be understood that other embodiments would be evident based on the present disclosure and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the invention are semi-diagrammatic and not to scale and, particularly, some of the dimensions are for the clarity of presentation and are shown exaggerated in the drawing FIGS. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the plane or surface of a substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

The present invention relates generally to a stacked semiconductor package with assorted multi-chip modules interconnected via an edge connection system. By stacking a plurality of multi-chip modules together, a high strength module can result even though the individual substrates are extremely thin and of relatively low strength. The edge connection system provides structural support, as well as an electrical interconnection conduit, for the stacked semiconductor package. By employing the edge connection system, the multi-chip modules can be vertically stacked, thereby reducing the dimensions and the number of layers of the semiconductor package. Additionally, the edge connection system permits removal of the individual multi-chip modules for repair and replacement.

Referring now to FIG. 1, therein is shown a cross-sectional view of an integrated circuit package system 100 in accordance with an embodiment of the present invention. FIG. 1 depicts substrates 101-103, semiconductor devices 104A-G, an edge connection system 106, an interposer 108, a flat ribbon cable 110, and a heat spreader 112.

The substrates 101-103 can be fabricated from ceramics, silicon, silicon based composites, plastics, or laminates of various types (organic or inorganic), which are compatible chemically, thermally, and mechanically with the process conditions chosen for the integrated circuit package system 100.

Although the substrates 101-103 are depicted as substantially similar in size and shape, it is to be understood that the substrates 101-103 may take any shape or size as required by the design specifications of the integrated circuit package system 100. Additionally, although the present invention depicts three of the substrates 101-103 vertically stacked one over another, it is to be understood that the present invention encompasses any number of the substrates vertically stacked one over another.

For integration into the next level of assembly, the substrates 101 and 102 are shown with electrical edge connectors 105, for receiving, generating, or continuing an electrical signal, on one or more edges of the substrates 101 and 102. By way of example, the electrical edge connectors 105 may include conductive protrusions, such as leads, pins, wires, pads, balls, fingers, or other electrical interconnection systems well known within the art and not repeated herein.

Conversely, the electrical edge connectors 105 may include conductive depressions, which mate with conductive protrusions in the edge connection system 106. Furthermore, the electrical protrusions and the electrical depressions of the substrates 102 and the edge connection system 106 may be configured and arranged to snap together via a friction fit mechanism. This friction fit mechanical interconnection is readily detachable but may be made permanent by simply soldering or bonding the interconnection.

However, it is to be understood that the type of electrical edge connector and mating connector chosen is not essential, what is important is that the electrical edge connector 105 permit transmission of electrical signals by conductors 107 between semiconductor devices 104A-E on the substrates 101 and 102.

The semiconductor devices 104 formed above and below the substrates 101-103 may include semiconductor chips and integrated circuit packages selected from active components, passive components, surface mount components, stacked components, and so forth, in numerous configurations and arrangements as may be needed.

By way of example and not by way of limitation, the semiconductor devices 104A-G may more specifically include quad-flat non-leaded packages, wire bond packages, single and dual-side memory packages, internal stacking module packages, flip-chip packages, modular packages, application-specific-integrated-circuit (ASIC) packages, stacked die packages or any combination thereof. Furthermore, the semiconductor devices 104A-G may further include, by way of example and not by way of limitation, wire bond die, flip-chip die, stacked die, modular die, ASIC die, passive devices, or any combination thereof.

Additionally, the present invention includes semiconductor package configurations, such as package-in-package (PiP) and package-on-package configurations (PoP). The PiP system is a 3D package system that stacks a fully tested Internal Stacking Module (ISM) on top of a Base Assembly Package (BAP) to form a single Chip Scale Package (CSP). PoP is a 3D package in which fully tested packages are stacked on top of another single or stacked package during the board mount process. As an exemplary illustration, the semiconductor devices 104D and 104C are respectively PiP and PoP configurations.

It is to be understood that the semiconductor devices 104A-G and the integrated circuit package system 100 of the present invention cover a wide range of package and die configurations, and the type of package or die configuration employed is only limited by the design specifications of the integrated circuit package system 100.

Notably, the present invention allows for testing of the semiconductor devices 104A-G before bonding them to the substrates 101-103, therefore ensuring the use of known good die or packages in the manufacturing process. Additionally, after bonding the semiconductor devices 104A-G to the substrates 101-103, these multi-chip modules/sub-assemblies can also be tested before incorporation into the integrated circuit package system 100. This ensures that the integrated circuit package system 100 includes known good sub-assemblies, and thereby improves the assembly process yield for packaging.

The edge connection system 106 acts as a mechanical support and an electrical interconnection for the substrates 101 and 102, and as a mechanical support for the substrate 103 and the heat spreader 112. In at least one embodiment, during attachment, the substrates 101-103 can be inserted into the edge connection system 106. The edge connection system 106 includes an elongated body with internal electrical circuitry and electrical contacts spaced vertically along an axis for receiving the electrical edge connectors 105 of the substrates 101 and 102 and connecting them together and/or to an external passive or active system (not shown), such as a printed circuit board or another package. The edge connection system 106 may be made from an insulating material with high temperature resistance.

If only one of the edge connection systems 106 is employed, the substrates 101 and 102 are inserted into the edge connection system 106 in a cantilevered fashion. However, if more than one of the edge connection systems 106 is employed, the edge connection systems 106 can be situated around the substrates 102 in any number and in any manner desired to provide mechanical support and electrical interconnection.

For example, in accordance with the scope of the present invention the integrated circuit package system 100 may employ only one of the edge connection systems 106 on one edge of the integrated circuit package system 100. In a further example, the integrated circuit package system 100 could employ two or more of the edge connection systems 106 on different edges of the integrated circuit package system 100.

Additionally, the edge connection systems 106 chosen may or may not cover the entire length of an edge of the integrated circuit package system 100. For example, two of the edge connections systems 106 mounted on an edge of the integrated circuit package system 100 may cover only a portion of that edge. Alternatively, just one of the edge connection systems 106 may cover an entire length of an edge of the integrated circuit package system 100.

Notably, the electrical contacts of the edge connection system 106 permit attachment and removal of the substrates 101-103 for repair or replacement. For instance, by permitting such functionality, the substrates 101-103 can be removed for repair to or replacement of damaged circuits. The substrates 101-103 also can be replaced when system upgrades become available.

In general, structural support can be provided to the integrated circuit package system 100 by secondary support structures slidably separating the substrates 101-103 or one of the substrates 102 and the heat spreader after they are slid into the edge connection system 106. The interposer 108 with its solder balls is an example of a secondary support structure. The secondary support structures provide structural support to the integrated circuit package system 100 by connecting the substrates 101 and 102 together. Other secondary support structures hold the substrate 102 and the heat spreader 112 together. For example, the secondary support structures may include the semiconductor devices 104E and 104F in contact with both the substrate 102 and the heat spreader 112. In this situation, the heat is conducted from the semiconductor devices 104E and 104F to the heat spreader 112.

The interposer 108 provides structural support to the substrates 101 and 102 especially in an integrated circuit package system 100 having one edge connection system 106. The structural support offered by the interposer 108 helps to prevent warpage and co-planarity issues encountered, by the substrates 102, during surface mount and reflow processes.

In addition to providing structural support, the interposer 108 can further electrically interconnect the substrates 101 and 102, and may also be configured to provide an electromagnetic interference shield for integrated circuits sensitive to high frequency noise.

It is to be understood that the present invention may employ one or more of the interposers 108 within the integrated circuit package system 100. Placement of the interposers 108 will depend upon factors such as, structural support, electrical interconnectivity, and electromagnetic shielding requirements.

By employing one or more of the interposers 108, shorter electrical transmission paths are established between the substrates 101 and 102 for increased signal speeds. The interposer 108 may include conductive elements such as conductive vias formed within the interposer 108 for connecting other contacts on the interposers 108.

If the integrated circuit package system 100 requires additional electrical or optical transmission paths, such as between the substrates 102 and 103, the flat ribbon cable 110 can establish them. Although the flat ribbon cable 110 is shown on a edge of the integrated circuit package system 100 without the edge connection system 106, it is to be understood that the electrical connections established by the flat ribbon cable 110 can be formed on any edge of the integrated circuit package system 100, including the edge with the edge connection system 106. For example, if the integrated circuit package system 100 employs two of the edge connection systems 106 on a single edge of the integrated circuit package system 100, the flat ribbon cable 110 could be situated on the same edge as or between two edge connection systems 106 to minimize the dimensions of the package.

The heat spreader 112 may be configured between any of the substrates 102 as needed by the design specifications. The heat spreader 112 may be made from materials, such as metals, metal alloys, ceramics, thermally conductive materials, or any combination thereof. The heat spreader 112 not only acts to dissipate heat between adjacent heat generating components but it may also form an electromagnetic interference shield for integrated circuits sensitive to high frequency noise.

As an exemplary illustration, the heat spreader 112 is shown in FIG. 1 as covering the entire top surface area of the substrate 102 on the bottom of the integrated circuit package system 100. However, it is to be understood that the heat spreader material need only cover that portion of the substrate, which requires heat dissipation or electromagnetic interference shielding.

Additionally, by way of example, the heat spreader 112 may include a plug-in or insertion type mechanism for connection to the edge connection system 106. Alternatively, it may be positioned between the substrates 102 and 103 without interconnection to the edge connection system 106.

Figure 2:
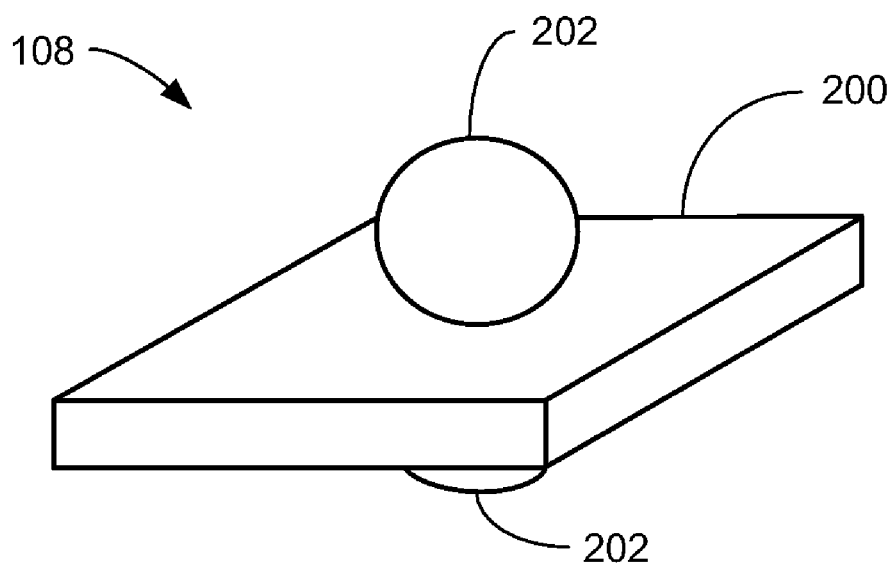
FIG. 2 is an isometric view of the interposer in accordance with an embodiment of the present invention.

Referring now to FIG. 2, there is shown an isometric view of the interposer 108 in accordance with an embodiment of the present invention. The interposer 108 is depicted as square in shape but may be any shape necessary to match the packaging structure or a substrate. Contacts 202 are formed above and below the interposer 108. The contacts 202 provide electrical interconnection between the substrates 101 and 102, of FIG. 1. The contacts 202 could also be a solder ball array such as a ball grid array ("BGA") to provide greater stability and to provide a number of connections.

Figure 3:
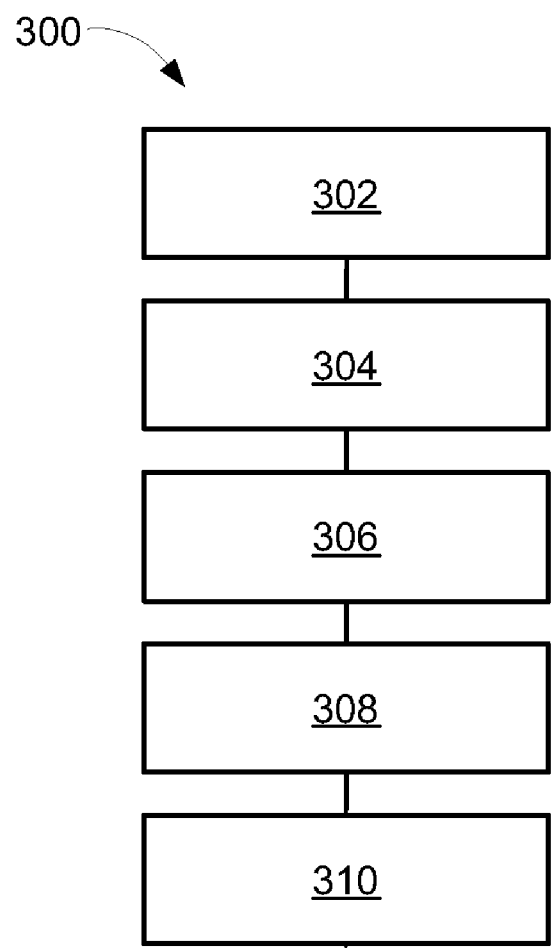
FIG. 3 is a flow chart for an integrated circuit package system for fabricating the integrated circuit package system in accordance with an embodiment of the present invention.

Referring now to FIG. 3, therein is shown a flow chart for an integrated circuit package system 300 for fabricating the integrated circuit package system 100 in accordance with an embodiment of the present invention. The integrated circuit package system 300 includes providing a plurality of substrates in a block 302; forming a plurality of semiconductor devices on each of the substrates in a block 304; providing an edge connection system in a block 306; configuring an electrical edge connector on each of the substrates for attachment to the edge connection system in a block 308; and forming a vertically stacked configuration of the substrates by attaching the substrates to the edge connection system in a block 310.

It has been discovered that the present invention thus has numerous advantages. A principle advantage is that substrates, such as multi-chip modules, can be vertically stacked using an edge connection system, thereby reducing the footprint dimension of the entire package system.

Another advantage of the present invention is that reduced multi-chip module board sizes prevents warpage and co-planarity issues that arise during surface mount and reflow process techniques.

Another advantage of the present invention is that the edge connection system permits removal of the substrates for repair and/or replacement.

Yet still, another advantage of the present invention is that the interposer can be used as a support mechanism to hold the substrates firmly in place. Furthermore, the interposer provides for the shortest electrical pathway between adjacent substrates, thereby improving the speed of the device.

These and other valuable aspects of the present invention consequently further the state of the technology to at least the next level.

Thus, it has been discovered that the integrated circuit package system of the present invention furnishes important and heretofore unknown and unavailable solutions, capabilities, and functional advantages. For instance, by vertically stacking substrates via an edge connection system; footprint area is reduced, warpage and co-planarity issues are mitigated, and substrate removal is permitted for replacement and/or repair. The resulting processes and configurations are straightforward, cost-effective, uncomplicated, highly versatile and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
providing a plurality of substrates;
forming a plurality of semiconductor devices on at least one of the plurality of substrates;
forming an interposer with contacts between adjacent substrates;
providing an edge connection system;
configuring an electrical edge connector on at least one of the plurality of substrates for attachment to the edge connection system; and
forming a vertically stacked configuration of the substrates by inserting the plurality of substrates into the edge connection system.

2. The method as claimed in claim 1 wherein:
forming the interposer provides mechanical stability and an electrical interconnection.

3. The method as claimed in claim 2 further comprising:
connecting at least two of the plurality of substrates using an electrical or optical ribbon cable.

4. The method as claimed in claim 1 further comprising:
testing at least one of the plurality of semiconductor devices before integration into the integrated circuit package system.

5. The method as claimed in claim 1 further comprising:
forming a heat spreader connected to the edge connection system.

6. A method of manufacture of an integrated circuit package system comprising:
providing an edge connection system;
providing a plurality of substrates including electrical edge connectors, the substrates inserted into the edge connection system;
forming a heat spreader between the plurality of substrates that require heat dissipation; and
forming a secondary support structure slidably separating the plurality of substrates or one of the plurality of substrates and the heat spreader.

7. The method as claimed in claim 6 wherein:
forming the secondary support structure includes forming integrated circuit packages, semiconductor chips, or interposers.

8. The method as claimed in claim 6 further comprising:
forming a plurality of semiconductor devices on at least one of the plurality of substrates, the plurality of semiconductor devices selected from integrated circuit packages and semiconductor chips.

9. The method as claimed in claim 8 wherein:
forming the integrated circuit packages includes forming quad-flat non-leaded packages, wire bond packages, single and dual-side memory packages, internal stacking module packages, flip-chip packages, modular packages, application-specific-integrated-circuit packages, stacked die packages or a combination thereof.

10. The method as claimed in claim 8 wherein:
forming the semiconductor chips includes forming wire bond die, flip-chip die, stacked die, modular die, application-specific-integrated-circuit die, passive devices or a combination thereof.

11. An integrated circuit package system comprising:
a plurality of substrates;
a plurality of semiconductor devices on at least one of the plurality of substrates;
an interposer with contacts between adjacent substrates;
an edge connection system;
an electrical edge connector on at least one of the plurality of substrates for attachment to the edge connection system; and
the plurality of substrates inserted within the edge connection system in a vertically stacked configuration.

12. The system as claimed in claim 11 wherein:
the interposer provides mechanical stability and an electrical interconnection.

13. The system as claimed in claim 12 further comprising:
an electrical or optical ribbon cable connecting at least two of the plurality of substrates.

14. The system as claimed in claim 11 wherein:
the plurality of semiconductor devices include tested semiconductor devices.

15. The system as claimed in claim 11 further comprising:
a heat spreader for providing an electro-magnetic interference shield for at least one of the plurality of semiconductor devices sensitive to high frequency noise.

16. The system as claimed in claim 11 further comprising:
a heat spreader; and
a secondary support structure slidably separating one of the plurality of substrates and the heat spreader.

17. The system as claimed in claim 16 wherein:
the secondary support structure includes integrated circuit packages or semiconductor chips.

18. The system as claimed in claim 11 wherein:
the plurality of semiconductor devices on at least one of the plurality of substrates are selected from integrated circuit packages and semiconductor chips.

19. The system as claimed in claim 18 wherein:
the integrated circuit packages include quad-flat non-leaded packages, wire bond packages, single and dual-side memory packages, internal stacking module packages, flip-chip packages, modular packages, application-specific-integrated-circuit packages, stacked die packages or a combination thereof.

20. The system as claimed in claim 18 wherein:
the semiconductor chips include wire bond die, flip-chip die, stacked die, modular die, application-specific-integrated-circuit die, passive devices or a combination thereof.

* * * * *